United States Patent [19]

Muroga

[11] Patent Number: 4,980,745
[45] Date of Patent: Dec. 25, 1990

[54] SUBSTRATE POTENTIAL DETECTING CIRCUIT

[75] Inventor: Hiroki Muroga, Yokohama, Japan

[73] Assignee: Kabushiki Kaisha Toshiba, Kawasaki, Japan

[21] Appl. No.: 523,178

[22] Filed: May 15, 1990

Related U.S. Application Data

[63] Continuation of Ser. No. 277,176, Nov. 29, 1988, abandoned.

[30] Foreign Application Priority Data

Nov. 30, 1987 [JP] Japan .................................. 62-302603

[51] Int. Cl.⁵ ............................................ H01L 27/02
[52] U.S. Cl. ............................................ 357/42; 357/86
[58] Field of Search ..................................... 357/42, 86

[56] References Cited

U.S. PATENT DOCUMENTS

| | | |
|---|---|---|
| 3,720,848 | 7/1971 | Schmidt . |
| 4,336,489 | 6/1982 | Frederiksen ........................... 357/42 |
| 4,628,340 | 12/1986 | Hashimoto ............................. 357/42 |
| 4,823,314 | 4/1989 | Sharp ..................................... 357/42 |
| 4,829,359 | 5/1989 | O et al. .................................. 357/42 |

Primary Examiner—Gene M. Munson
Attorney, Agent, or Firm—Finnegan, Henderson, Farabow, Garrett and Dunner

[57] ABSTRACT

Diffusion layers are formed in a surface region of an N-type substrate. The diffusion layers are interconnected by means of an Al wiring layer. A P-well is formed in the substrate. A power source potential is connected to the substrate and a reference potential is connected to the P-well 17. The Al wiring layer is connected to the power source potential via the substrate to detect the power source potential.

11 Claims, 5 Drawing Sheets

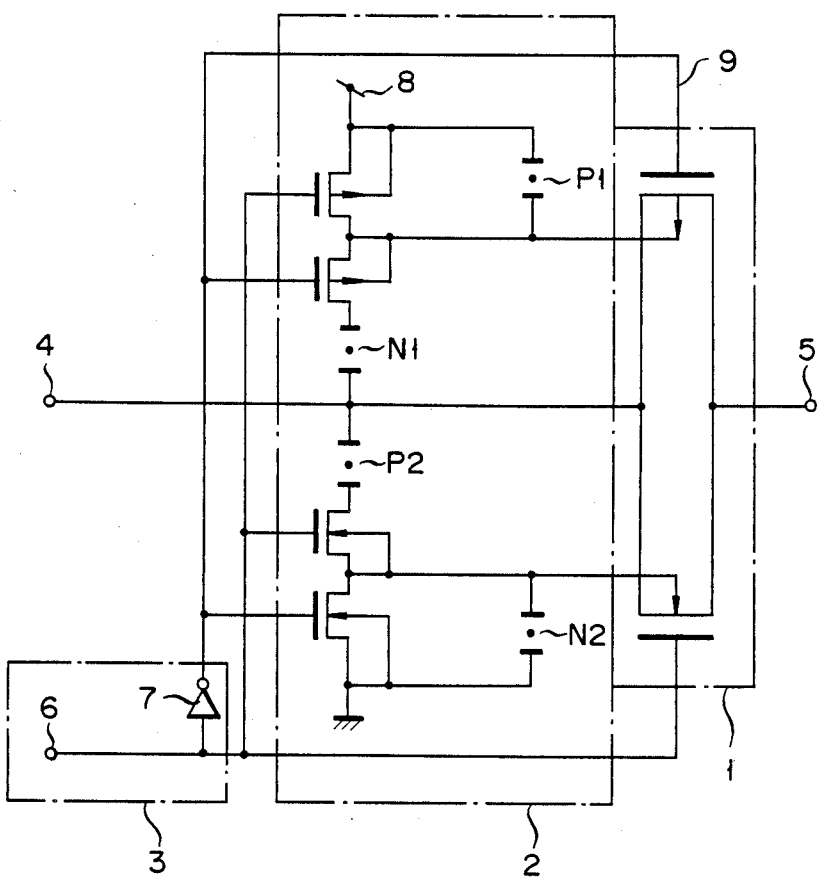
F I G. 1

FIG. 5
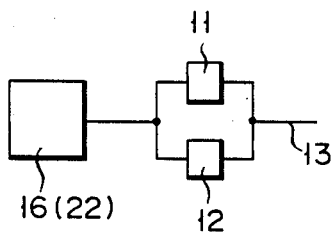
| | SUBSTRATE POTENTIAL | DETECTED POTENTIAL |
|---|---|---|
| P-well PROCESS | VDD | VDD |
| N-well PROCESS | VSS | VSS |
FIG. 6
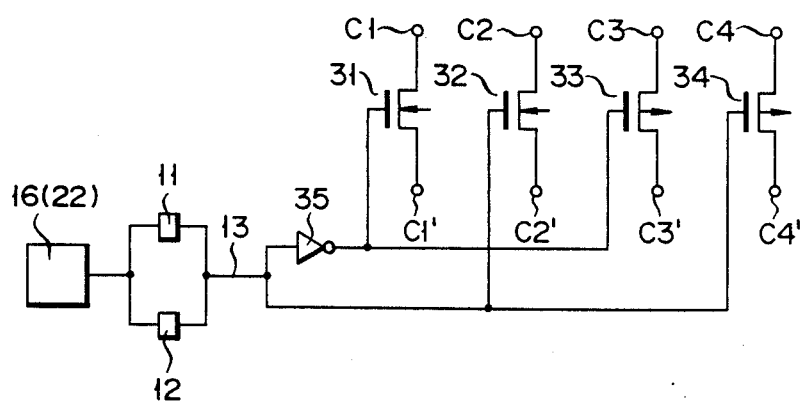
FIG. 7

|  | MOS 31 | MOS 32 | MOS 33 | MOS 34 |
|---|---|---|---|---|
| P-well PROCESS | OFF | ON | ON | OFF |
| N-well PROCESS | ON | OFF | OFF | ON |
F I G. 8
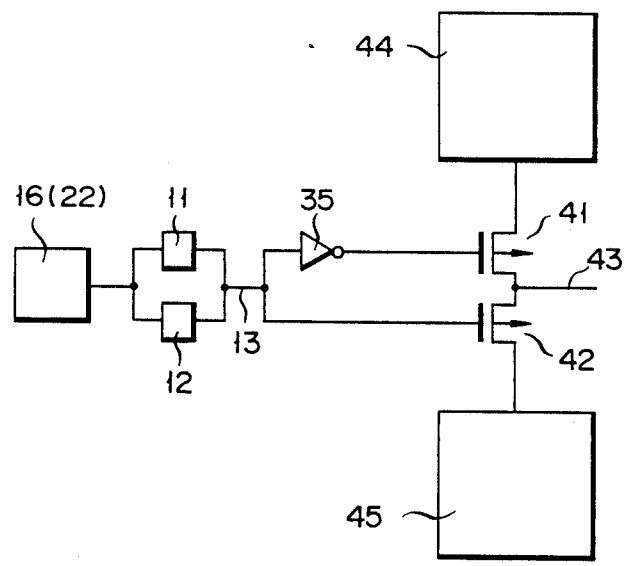
F I G. 9

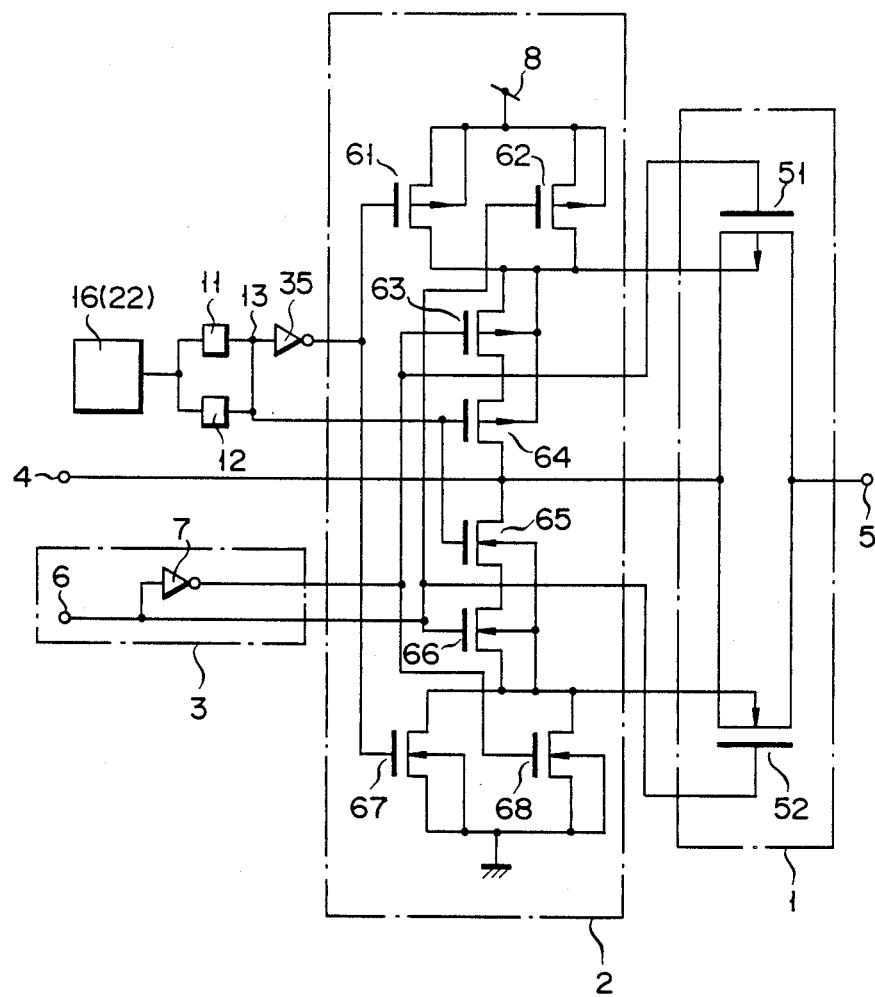
F I G. 10

SUBSTRATE POTENTIAL DETECTING CIRCUIT

This application is a continuation of application Ser. No. 07/277,176 filed Nov. 29, 1988 now abandoned.

BACKGROUND OF THE INVENTION

1. Field of the Invention

The present invention relates to a substrate potential detecting circuit in an integrated circuit (IC) with a complementary field effect transistor (FET) structure. More particularly, the present invention relates to a substrate potential detecting circuit used in an IC which may be manufactured by either a P-well process or an N-well process.

2. Description of the Related Art

In a layout design of the complementary semiconductor IC, it is a common practice that a layout pattern of the semiconductor device is designed so as to be adaptable for both a P-well structure and an N-well structure. In designing IC layout, a designer frequently handles two types of layout, one to be incorporated into a semiconductor layout only when the semiconductor layout is based on a P-well structure, and the other to be incorporated into a semiconductor layout only when it is based on an N-well structure. In this case, either one of the following two measures has generally been taken. In the first measure, both the layouts for the P-well and N-well, in design, are incorporated into a single semiconductor layout system. At the manufacturing stage, an Al (aluminum) wiring pattern is changed and/or modified to incorporate the intended type of the layout into the semiconductor layout. In the second measure, two different layouts for the respective well structures are designed.

The first measure employs an Al master slice method for changing and/or modifying the wiring pattern. In this method, the data of the Al wiring pattern necessary for the change and/or modification is prepared, then combined with the Al wiring pattern data common for both the P-well and N-well structures, thereby forming the desired Al wiring pattern data. The first measure, however, has the following two disadvantages. One is that a blank space must be reserved for the future use in the changing and/or modifying process of the Al wiring layer. The second is that two types of data, i.e., the data of the common Al wiring pattern and the data for the master slicing, must be prepared for obtaining a desired Al wiring pattern, and hence complicated data processing is required.

The second measure also has a disadvantage. This measure needs different layout designs respectively for the P-well structure and the N-well structure, so design work is doubled and consequently the possibility of error is increased.

FIG. 1 shows a transfer gate circuit when the Al master slice method is used. In the figure, P1 and P2, and N1 and N2 are open circuit points. When the transfer gate circuit of FIG. 1 is fabricated into a P-well structure and an N-well structure, those open circuit points become closed circuit points through the wiring layer based on the Al master slice method. The circuit points P1 and P2 are originally open, and when the semiconductor circuit is fabricated into the P-well structure, these are closed. The same thing is correspondingly applied for the circuit points N1 and N2. In FIG. 1, reference numeral 1 designates a transfer gate circuit; 2, a back-gate effect suppressing circuit; 3, a control circuit for transfer gate 1; 4, an input terminal; 5, an output terminal; 6, a control terminal; 7, an inverter; 8, a power source terminal; and 9, an interconnection wire made of, for example, aluminum.

SUMMARY OF THE INVENTION

With a view to overcoming the above-mentioned problems of the prior art, the present invention has as its object to provide a circuit means which is used for realizing semiconductor circuits formed by a P-well process, as well as by an N-well process, but without increasing the chip area and complicating the data processing.

According to the present invention, there is provided a substrate potential detecting circuit comprising a semiconductor substrate of a first conductivity type, a well region of a second conductivity type, a first semiconductor region of the first conductivity type formed in said semiconductor substrate, a second semiconductor region of the second conductivity type formed in said semiconductor substrate, and a wiring layer interconnecting said first and second semiconductor regions and serving as a detecting terminal for detecting the potential of said semiconductor substrate.

BRIEF DESCRIPTION OF THE DRAWINGS

FIG. 1 is a circuit diagram showing a transfer gate circuit of prior art;

FIG. 5 is a block diagram schematically showing the substrate potential detecting circuit shown in FIGS. 2 through 5;

FIG. 6 is a table showing the relationship between well-processes and detected substrate potential in the substrate potential detecting circuit shown in FIGS. 2 through 5;

FIG. 7 is a circuit diagram showing a first application of the substrate potential detecting circuit shown in FIGS. 2 to 5 in which it is connected to a transistor circuit;

FIG. 8 is a table showing the relationship between well processes and switching modes in the circuit of FIG. 7;

FIG. 9 is a circuit diagram showing a second application of the substrate potential detecting circuit shown in FIGS. 2 to 5; and FIG. 10 is a circuit diagram showing a third application of the substrate potential detecting circuit shown in FIGS. 2 to 5, in which it is applied to a transfer gate circuit.

DETAILED DESCRIPTION OF THE PREFERRED EMBODIMENTS

Figures 2, 3, 4:
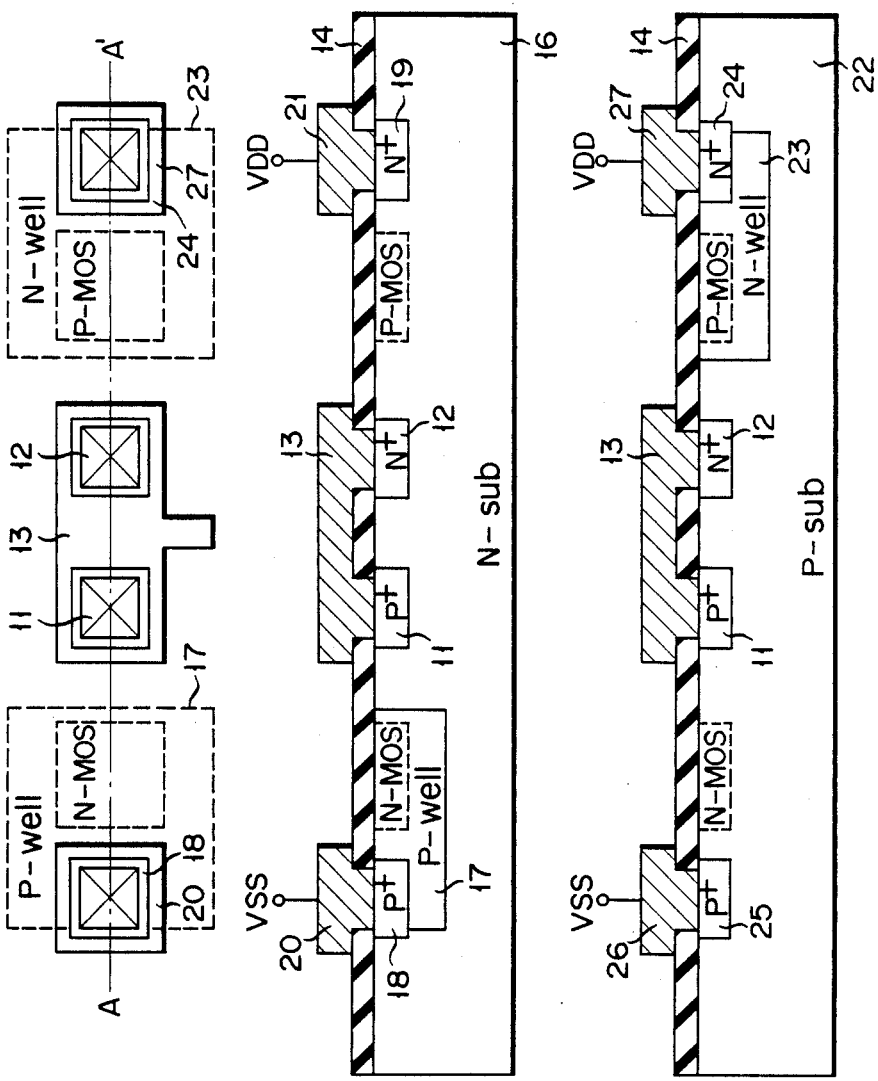
FIG. 2 is a plan view showing a pattern of a substrate potential detecting circuit according to the present invention.
FIG. 3 is a sectional view taken on line A—A in FIG. 2, in which a P-well region is contained in the structure.
FIG. 4 is a sectional view taken on line A—A in FIG. 2, in which an N-well region is contained in the structure.

A preferred embodiment of a substrate potential detecting circuit according to the present invention will be described, referring to the accompanying drawings.

FIG. 2 is a plan view showing a pattern of a substrate potential detecting circuit according to the present invention. FIG. 3 is a sectional view taken on line A—A' in FIG. 2, in which the substrate potential detecting circuit and a P-well region are formed in an N-type semiconductor substrate. FIG. 4 is a sectional view taken on line A—A' in FIG. 2, in which the substrate potential detecting circuit and an N-well region are formed in a P-type semiconductor substrate.

In FIGS. 2 through 4, reference numeral 11 designates a P-type diffusion layer; 12, an N-type diffusion layer; 13, an Al (aluminum) wiring layer interconnecting diffusion layers 11 and 12; and 14, an oxide insulating film.

In FIG. 3, diffusion layers 11 and 12 are formed in the surface region of N-type substrate 16. The diffusion layers 11 and 12 are interconnected by means of Al wiring layer 13. P-well 17 is formed in substrate 16. A p+ contact region 18 of a high impurity concentration is further formed in P-well 17. An N channel MOS transistor is formed in P-well 17, and a P channel MOS transistor is formed in substrate 16. An N+ contact region 19 is also formed in substrate 16. Contact region 18 is connected through electrode layer 20 to a reference potential, e.g., ground potential VSS. Contact region 19 is connected through electrode layer 21 to power source potential VDD.

In FIG. 4, diffusion layers 11 and 12 are formed in the surface region of P-type substrate 22. The diffusion layers 11 and 12 are interconnected by means of Al wiring layer 13. N-well 23 is formed in substrate 22. A P channel MOS transistor is formed in N-well 23, and an N channel MOS transistor is formed in substrate 22. A N+ contact region 24 having a high impurity concentration is further formed in N-well 23. A P+ contact region 25 is also formed in substrate 22. Contact region 25 is connected through electrode layer 26 to a reference potential, e.g., ground potential VSS. Contact region 24 is connected through electrode layer 27 to power source potential VDD.

In the semiconductor device of the P-well structure shown in FIG. 3, power source potential VDD is applied to N-type substrate 16, through N+ region 19 and electrode 21. Reference potential VSS is applied to P-well region 17, through P+ region 18 and electrode 20.

In the semiconductor device of the N-well structure shown in FIG. 4, reference potential VSS is applied to P-type substrate 22, through P+ region 25 and electrode 26. Power source potential VDD is applied to N-well region 23, through N+ region 24 and electrode 27.

In the semiconductor device shown in FIGS. 2 through 4, a substrate potential detecting circuit which is shown by an equivalent circuit shown in FIG. 5, is formed by the diffusion layers 11 and 12, with Al wiring layer 13 connecting the layers. In the P-well structure of FIG. 3, Al wiring layer 13 is connected to power source potential VDD, through N diffusion layer 12, N type substrate 16, N+ region 19, and electrode 21. The detection of the substrate potential VDD is as illustrated in FIG. 6.

In the N-well structure of FIG. 4, Al wiring layer 13 is connected to reference potential VSS, through P diffusion layers 11, P type substrate 22, P+ region 25, and electrode 26. The detection of the substrate potential VSS is as illustrated in FIG. 6.

The detected potential by the substrate potential detecting circuit may be used as a control potential (e.g., date control potential of a MOS transistor, for example) of a node-connecting element (e.g., a MOS transistor) in a transistor circuitry.

FIG. 7 is a circuit diagram of an application of the substrate potential detecting circuit in which it is combined with a transistor circuitry. FIG. 8 is a table showing the relationship between well structure and switching mode in the application arrangement of FIG. 7. In FIG. 7, reference numerals 31 and 32 designate N channel transistors; 33 and 34, P channel transistors; and 35, an inverter.

Wiring layer 13 is connected directly to the gates of MOS transistors 32 and 34, and connected through inverter 35 to the gates of MOS transistors 31 and 33. MOS transistor 31 is connected between nodes C1 and C1'. Similarly, other transistors 32 to 34 are connected between paired nodes C2 and C2', C3 and C3', and C4 and C4', respectively. In this circuit arrangement, in the case of the P-well structure, a detected potential at wiring layer 13 is power source potential VDD. Under this condition, the switch modes of MOS transistors 31 to 34 are OFF, ON, ON, and OFF, as shown in FIG. 8. Accordingly, nodes C2 and C2' are interconnected, and nodes C3 and C3' are also interconnected.

In the case of the N-well structure, a detected potential (substrate potential) at wiring layer 13 is power reference potential VSS. Under this condition, the switch modes of MOS transistors 31 to 34 are ON, OFF, OFF, and ON, as shown in FIG. 8. Accordingly, nodes C1 and C1'are interconnected, and nodes C4 and C4' are also interconnected.

By using the output potential of the substrate potential detecting circuit as a gate control potential of the transistors in a transistor circuitry, as described above, the desired pairs of nodes in the transistor circuitry can be interconnected without the pattern change and/or modification by the master slice method, and regardless of the type of well structure, P-well or N-well.

Turning now to FIG. 9, an application arrangement of a substrate potential detecting circuit according to the present invention is shown. In the application arrangement, the detected output potential of the substrate potential detecting circuit is used for a gate control potential of N channel MOS transistors 41 and 42 as node-connecting elements. The detected potential at the output of the substrate potential detecting circuit is applied directly to the gate of transistor 42, and applied through inverter 35 to the gate of transistor 41. A first end of MOS transistor 41 is connected to circuit 44 which is incorporated into a semiconductor circuit when it is of the P-well structure type. A first end of MOS transistor 42 is connected to circuit 45 which is incorporated into a semiconductor circuit when it is of the N-well type of structure. The second ends of transistors 41 and 42 are interconnected to provide a node 43.

In the case of a P-well structure as shown in FIG. 9, the detected potential is power source potential VDD, and turns on transistor 41, and turns off transistor 42. As a result, circuit 44 is incorporated into a main semiconductor circuit. In the case of an N-well structure, the detected potential is reference potential VSS, which turns off transistor 41, and turns on transistor 42. As a result, circuit 45 is incorporated into the main semiconductor circuit.

Thus, by controlling MOS transistors 41 and 42 by the output potential of the substrate potential detecting circuit, circuits 44 and 45 may be incorporated into main semiconductor circuits, so that there is no need for pattern change and/or modification by the master slice method.

FIG. 10 shows a circuit arrangement of another application of a substrate potential detecting circuit according to the present invention in which the detecting circuit is coupled with a transfer gate circuit. This circuit arrangement corresponds to that of FIG. 1 used in the prior art description. Therefore, like portions and equivalent portions are designated by like reference symbols in FIG. 1, for simplicity. In FIG. 10, reference numeral 1 represents a transfer gate circuit; 2, a wave-shaping circuit; 3, a circuit for controlling gate circuit 1; 4, an input terminal; 5, output terminal; 7, an inverter; 8, a power source potential circuit; and 9, a wiring layer.

Transfer gate circuit 1 is made up of P channel MOS transistor 51 and N channel MOS transistor 52, which are coupled in parallel with each other. This circuit 1 is coupled at the input node to input terminal 4, and at the output node to output terminal 5.

Control circuit 3 comprises an inverter 7 with the input coupled with control terminal 6. Back-gate effect suppressing circuit 2 is made up of P channel MOS transistors 61 to 64, and N channel MOS transistors 65 to 68. The gates of transistors 61 and 67 are coupled for reception with an inverted output signal of a substrate potential-detecting circuit. The gates of transistors 64 and 65 receive a noninverted output signal of the substrate. Transistors 62 and 66 receive at the gates an output signal of inverter 7 of control circuit 3. Transistors 62 and 66 are coupled with control terminal 6, and receive a control signal. The first ends of transistors 61 and 62 are connected to power source potential terminal 8. The second ends of these transistors are coupled with the first ends of transistors 67 and 68, through a series of transistors 63 to 66. The second ends of transistors 67 and 68 are connected to a ground point (reference potential).

The gate of transistor 51 in transfer gate circuit 1 receives the output of inverter 7 in control circuit 3. The gate of transistor 52 is connected to control terminal 6, and receives a control signal. The first ends of transistors 51 and 52 are connected to input terminal 4, and also to an interconnection point of transistors 64 and 65 in back-gate effect suppressing circuit 2.

In the above circuit arrangement, transistor 61 corresponds to the select circuit point P1 in the prior circuit of FIG. 1, and is turned on for the P-well structure. Transistors 64, 65, and 67 correspond to select circuit points N1, P2 and N2, respectively.

In the circuit arrangement of FIG. 10 thus arranged, the open and close functions of the select circuit points are controlled through the switching operation of the transistors 61, 64, 65, and 67, which operate in response to the detected substrate potential from the substrate potential detecting circuit. Therefore, this circuit arrangement successfully eliminates the pattern changing-/or modifying work of the master slice method, and is operable for both the P-well structure and the N-well structure. The FIG. 10 circuit arrangement requires eight transistors for the back-gate effect suppressing circuit, whereas the FIG. 1 circuit arrangement requires only four transistors. However, the FIG. 1 circuit must reserve a large chip area in preparation for the wiring layer changing and/or modification, which is an essential function of that circuit. The reserved chip area is greater than the area required for forming the additional four transistors.

As seen from the aforegoing, the present invention has successfully provided a substrate potential detecting circuit which is used for realizing the semiconductor circuits manufactured by both the P-well process and N-well process, without increasing the chip area, the wiring layer changing and/or modification work, and the complicated data processing.

I claim:

1. A substrate potential detecting circuit comprising
    a semiconductor substrate of a first conductivity type in which a well region of a second conductivity type is formed;
    a first semiconductor region of the first conductivity type formed in said semiconductor substrate;
    a second semiconductor region of the second conductivity type formed in said semiconductor substrate, and separated from said first semiconductor region;
    a third semiconductor region of the first conductivity type formed in said semiconductor substrate and separated from said first and second semiconductor regions, the third semiconductor region being supplied with a potential for biasing said semiconductor substrate; and
    a wiring layer interconnecting said first and second semiconductor regions and serving as a potential detecting terminal for detecting the potential of said semiconductor substrate via said first semiconductor region of the first conductivity type.

2. A substrate potential detecting circuit according to claim 1, further comprising an inverter connected to said wiring layer to invert the level of output thereof, and a plurality of node-connecting elements connected between different nodes, control terminals of said node-connecting elements receiving the output signal of said wiring layer and the output signal of said inverter to selectively turn on said node-connecting elements so that nodes of the turned-on elements are interconnected.

3. A substrate potential detecting circuit according to claim 2, wherein said node-connecting elements are metal-oxide-semiconductor transistors.

4. A substrate potential detecting circuit according to claim 1, further comprising first, second and third nodes, a first node-connecting element connected between said first and second nodes and connected at the control terminal to said wiring layer, a second node-connecting element connected between said second and third nodes and connected at the control terminal to said wiring layer, wherein said first or second node-connecting element is turned on in response to a potential of said substrate, thereby interconnecting both the nodes of the turned-on node-connecting element.

5. A substrate potential detecting circuit according to claim 4, wherein said first and second node-connecting elements are metal-oxide-semiconductor transistors.

6. A substrate potential detecting circuit according to claim 4, further comprising a first circuit connected to said first node and a second circuit connected to said fourth node, wherein when said first node-connecting element is turned on, said first circuit is connected to said second node, and when said second node-connecting element is turned on, said second circuit is connected to said third node.

7. A substrate potential detecting circuit according to claim 6, wherein the first conductivity type of said semiconductor substrate is an N conductivity type, and the second conductivity type of said well region is a P conductivity type, a detected potential of said wiring layer is a power source potential, and, in response to the detected potential, said first node-connecting element is turned on.

8. A substrate potential detecting circuit according to claim 7, wherein said first and second node-connecting elements are metal-oxide-semiconductor transistors.

9. A substrate potential detecting circuit according to claim 6, wherein the first conductivity type of said semiconductor substrate is a P conductivity type, and the second conductivity type of said well region is a N conductivity type, a detected potential of said wiring layer is a power source potential, and, in response to the detected potential, said second node-connecting element is turned on.

10. A substrate potential detecting circuit according to claim 9, wherein said first and second node-connecting elements are metal-oxide-semiconductor transistors.

11. A substrate potential detecting circuit according to claim 6, wherein said first and second node-connecting elements are metal-oxide-semiconductor transistors.

* * * * *